(12) United States Patent
Hughes

(10) Patent No.: US 8,253,608 B2
(45) Date of Patent: Aug. 28, 2012

(54) DATA COMPRESSION AND DECOMPRESSION

(75) Inventor: Colin Jonathan Hughes, London (GB)

(73) Assignee: Sony Computer Entertainment Europe Ltd. (GB)

( * ) Notice: Subject to any disclaimer, the term of this patent is extended or adjusted under 35 U.S.C. 154(b) by 595 days.

(21) Appl. No.: 12/504,815

(22) Filed: Jul. 17, 2009

(65) Prior Publication Data

US 2010/0017424 A1 Jan. 21, 2010

(30) Foreign Application Priority Data

Jul. 21, 2008 (EP) .................................... 08252480

(51) Int. Cl.
*H03M 7/30* (2006.01)
(52) U.S. Cl. .......................................... 341/51; 341/87
(58) Field of Classification Search .................... 341/51, 341/87
See application file for complete search history.

(56) References Cited

U.S. PATENT DOCUMENTS

| | | | | |
|---|---|---|---|---|
| 4,906,991 | A * | 3/1990 | Fiala et al. | 341/51 |
| 5,502,439 | A * | 3/1996 | Berlin | 341/51 |
| 5,521,597 | A * | 5/1996 | Dimitri | 341/51 |
| 2009/0045991 | A1* | 2/2009 | Schneider | 341/60 |
| 2009/0121906 | A1* | 5/2009 | Schneider | 341/51 |

FOREIGN PATENT DOCUMENTS

GB 2 378 868 2/2003

OTHER PUBLICATIONS

Partial European Search Report dated Dec. 23, 2008, from the corresponding European Application.
European Search Report dated Mar. 30, 2009, from the corresponding European Application.
Salmon D. "Data Compression: The Complete Reference" Data Compression: The Complete Reference, Jan. 1, 1998, pp. 101-162, 357, XP002150106.
Abbie Barbir. "A Methodology for Performing Secure Data Compression" System Theory, Proceedings of the 29th Southeastern Symposium on Cookeville, IEEE Computer Society, Mar. 9, 1997, pp. 266-270.
Michael Roitzsch. "Slice-Balancing H.264 Video Encoding for Improved Scalability of Multicore Decoding" Proceedings of the 7th ACM and IEEE International Conference on Embedded Software, 2007, pp. 269-278.
David A. Bader, et al. "High performance combinatorial algorithm design on the Cell Broadband Engine processor" Parallel Computing, vol. 33, No. 10-11, Nov. 1, 2007, pp. 720-740.

* cited by examiner

*Primary Examiner* — Howard Williams
(74) *Attorney, Agent, or Firm* — Lerner, David, Littenberg, Krumholz & Mentlik, LLP

(57) ABSTRACT

Data decompression apparatus is disclosed which is arranged to act on compressed data comprising: an ordered stream of references to groups of previously decoded data items; an ordered stream of direct representations of data items to be decoded; and an ordered stream of flags indicating whether each successive decompression operation should act on a reference or a direct representation. The apparatus comprises an output memory area; a detector to detect the number n of consecutive flags indicating that a decompression operation should act on a direct representation; and a data copier for copying to the output memory area either a next referenced group of previously decoded data or a group of n consecutive direct representations from the ordered stream of direct representations.

6 Claims, 9 Drawing Sheets

DATA COMPRESSION AND DECOMPRESSION

BACKGROUND OF THE INVENTION

1. Field of the Invention

This invention relates to data compression and decompression.

2. Description of the Prior Art

Lempel and Ziv generated a number of lossless data compression algorithms such as the so-called LZ77 and LZ78 algorithms, which in turn form the basis for many variants including LZW, LZSS and others. They are both dictionary coders which achieve compression by replacing portions of the data with references to matching data that has already passed through both encoder and decoder. A matching section of data is encoded by a pair of numbers called a distance-length pair, effectively a counter (how many characters to copy) and a pointer (where to find the first such character in the already-encoded or already-decoded data). The distance-length pair can be seen as equivalent to the statement "each of the next length characters is equal to the character exactly distance characters behind it in the uncompressed stream."

During the encoding phase, the best possible match (of a string of characters to be encoded) is sought, which is to say that the system obtains the match within the available encoded data which gives the greatest length. This process will be illustrated schematically with reference to FIGS. 1a to 1c of the accompanying drawings.

Data which has already been encoded is stored in an area of memory called a "search buffer" 10. The search buffer may be big enough to hold all of the already-encoded data in a particular application, or may just hold a certain amount of most-recently-encoded data. Data to be encoded is stored in an area of memory called a "look-ahead buffer" 20. The first character in the look-ahead buffer 20 (in this case, the character "g") is the next character to be encoded. It will of course be appreciated that alphanumeric characters are used in the present application to illustrate data to be encoded, and the data are referred to as "characters", but this notation is just for clarity of the explanation. Naturally, it is not technically important whether the data represents alphanumeric characters, pixels, audio samples or whatever. Similarly, the size in bits of each such "character" is not technically important.

The encoder searches for instances of "g" in the search buffer 10. In the present example, two are found (FIG. 1a).

The encoder then tests the position following each instance of "g" in the search buffer to detect whether the next character in the look-ahead buffer (the character "f") follows either instance of "g". In fact it does in both instances (FIG. 1b), so the search proceeds to the next following character in the look-ahead buffer ("s"). This follows only one instance of "gf" (FIG. 1c), and the next-following character in the look-ahead buffer ("h") does not follow those three characters in the search buffer. So, the distance-length pair generated in respect of the first three characters of the look-ahead buffer is (13,3), where the string starts 13 characters back in the encoded sequence (the search buffer) and has a length of 3 characters.

If no matching strings of two or more characters are found in the search buffer, the character is encoded as a "literal", which is to say it is simply copied into the output data stream. So, the benefits of compression result from the use of distance-length pairs; the quoting of literals acts against the aims of data compression, because not only is a literal as large as the original character, there is also a need for some sort of a flag to indicate that it is a literal. Therefore, these techniques are well suited to data in which there is a good chance of repetition of character strings, in order to achieve a useful compression ratio.

In general, therefore, the compressed data generated by this type of process will be formed of distance-length pairs interspersed with literals.

FIGS. 2a to 2d schematically illustrate the decoding of a distance-length pair (13,3).

FIG. 2a illustrates a search buffer providing the decoded data available as the distance-length pair (13,3) is about to be decoded. In FIGS. 2b, 2c and 2d, a string of three characters starting from the position 13 characters back in the search buffer is copied across for output.

Data compression and decompression of this type are essentially linear processes, in that the successful encoding and decoding of the data relies on all previous data having been encoded or decoded.

An object of the invention is to seek to provide an improved data compression and/or decompression technique.

SUMMARY OF THE INVENTION

This invention provides data decompression apparatus arranged to act on compressed data comprising:

an ordered stream of references to groups of previously decoded data items;

an ordered stream of direct representations of data items to be decoded; and an ordered stream of flags indicating whether each successive decompression operation should act on a reference or a direct representation;

the apparatus comprising:

an output memory area;

a detector to detect the number n of consecutive flags indicating that a decompression operation should act on a direct representation; and a data copier for copying to the output memory area either a next referenced group of previously decoded data or a group of n consecutive direct representations from the ordered stream of direct representations.

Further respective aspects and features of the invention are defined in the appended claims.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 3A:
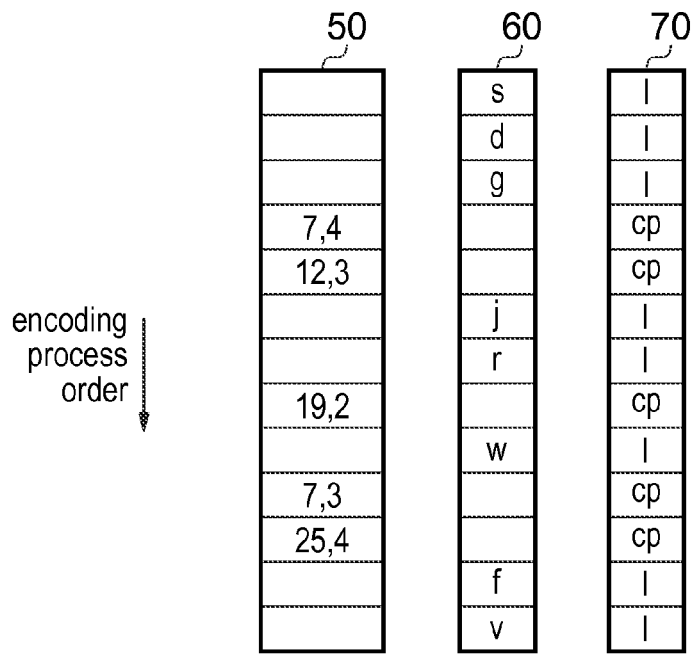
FIGS. 3a and 3b schematically illustrate three streams of data.
Figure 3B:
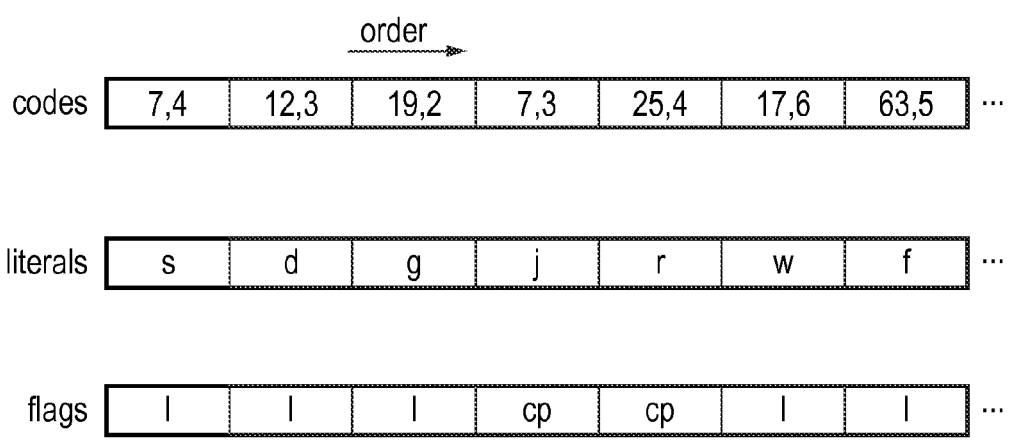

Referring now to FIGS. 3a and 3b, the data signal output by a compression process such as that described with reference to FIGS. 1 and 2 has been arranged (by the compression apparatus or as an intermediate process) as three streams of data: an ordered stream 50 of distance-length pairs (called "codes" in FIG. 3b); an ordered stream 60 of literals; and an ordered stream 70 of flags. The flags indicate whether the next data item to be decoded is a distance-length pair or a literal.

Figure 1A:
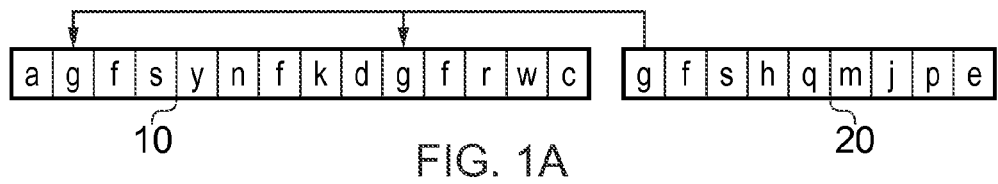
FIGS. 1a to 1c schematically illustrate a previously proposed data compression technique.
Figure 1B:
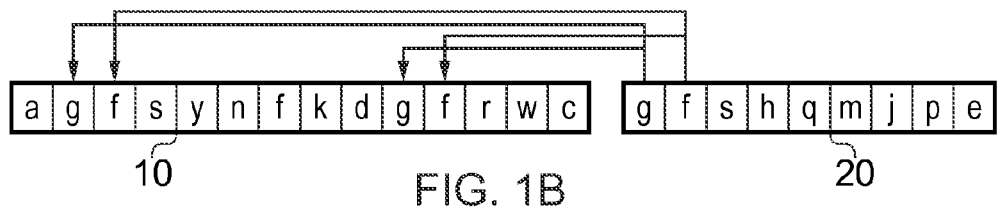
Figure 1C:
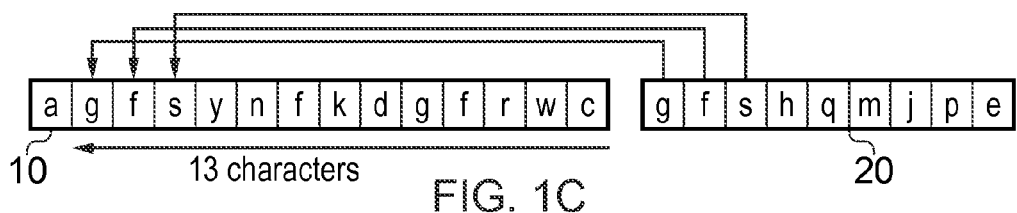
Figure 2A:
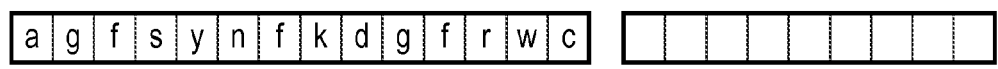
FIGS. 2a to 2d schematically illustrate a corresponding previously proposed data decompression technique.
Figure 2B:
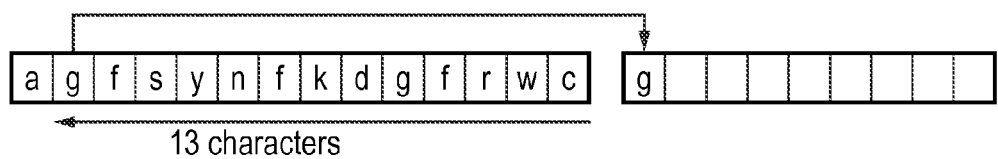
Figure 2C:
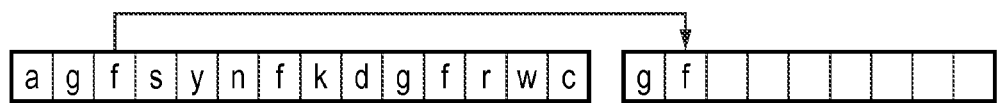
Figure 2D:
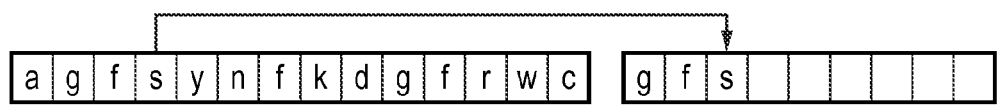

FIG. 3a shows the streams 50 and 60 as they might be subdivided from an interspersed single stream of distance-length pair and literals as generated by the technique of FIG. 1. The flags are schematically shows as "l" (literal) and "cp" (code pair, or distance-length pair.

In FIG. 3b the streams have been concatenated so as to remove gaps. At decoding, the next entry in the flag stream indicates whether to take the next item of encoded data from the code stream or the literal stream. Pointers (not shown) are maintained to indicate the next item in the code stream and the next item in the literal stream. The relevant pointer is updated (moved forward by one item) each time an item is taken from a stream for decoding.

Figure 4:
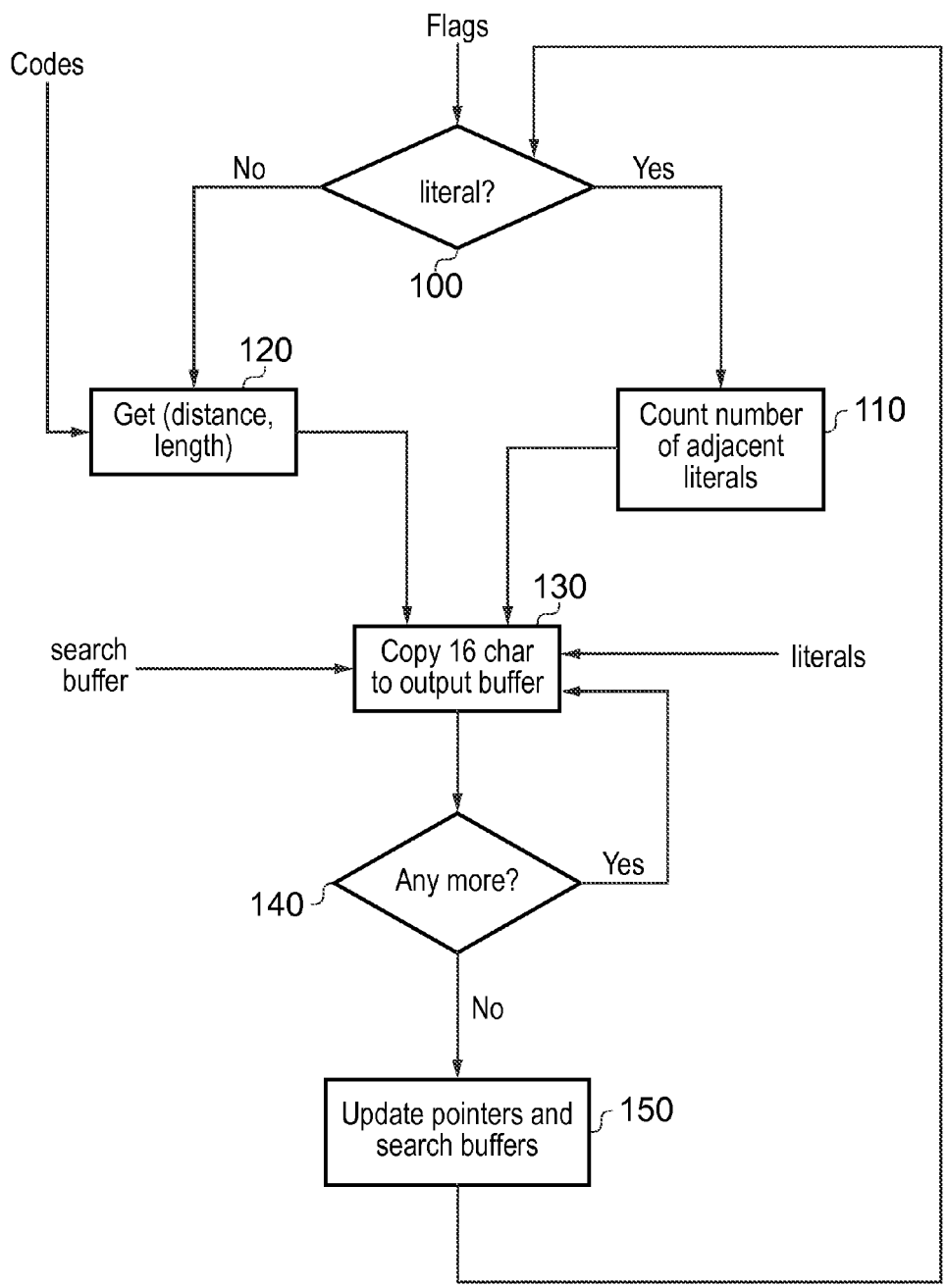
FIG. 4 is a schematic flow chart showing a decompression technique using the data streams of FIG. 3b.

FIG. 4 is a schematic flow chart showing a decompression technique using the data streams of FIG. 3b.

At a step 100, the next flag in the flag stream is examined to detect whether it indicates a literal or a code pair. If it indicates a literal, then at a step 110 the number of adjacent (consecutive) literals is established by counting the number of "literal" flags following the current one. This count can be done using normal analytical techniques within a data processing system, but in the present embodiment (see FIG. 11 below) using a "Cell" microprocessor developed by Sony Computer Entertainment®, Toshiba® and IBM®, the microprocessor actually has a single command which counts the length of a string of identical bits. So, the step 110 can be carried out quickly and easily by such a Cell microprocessor.

If the current flag does not indicate a literal, then the next code pair is examined at a step 120 to retrieve the distance and length quantities represented by that code pair.

At a step 130 a copy operation is carried out, in which a block of 16 adjacent characters is copied to a data output buffer (i.e. a place or area in memory where decoded data is stored):

(a) In the case that the current flag indicated a literal, the next 16 literals are copied from the literal stream to the output buffer.

(b) In the case that the current flag indicated a code pair, the 16 characters following the position in the search buffer indicated by the distance variable are copied to the output buffer.

The reason that a block of 16 characters is copied across, regardless of the number of characters actually indicated by the number of consecutive literal flags or by the length variable, is that the Cell microprocessor is particularly designed for efficient copying of blocks of this length. Naturally, it is quite unlikely that the actual number of literals or the length variable is exactly equal to 16. So, various measures have to be applied to deal with this.

Considering first the situation where the number of literals or the length variable is greater than 16, at a step 140 this situation is detected (the question "Any more?" detects whether there remain any more characters to be copied, i.e. whether the original number of literals or length variable, less the number of characters already copied, is greater than zero) and control passed back to the step 130 to copy another block of 16. This continues until the number of literals or previously decoded characters copied by the step 130 reaches or exceeds the required number.

At that point, control passes to a step 150. At this step, various pointers are updated. A pointer indicating a current output position in the output buffer is updated to show the last valid character written into the output buffer by the step 130 (i.e. it indicates the extent of validly decompressed data already written to the output buffer). Recalling that the step 130 copied 16 (or multiples of 16) characters so as to reach or exceed the required number, the last validly copied character will be somewhere within the last 16 characters copied by the step 130.

For example, assume that the number of consecutive literal flags detected by the step 110 was 7. At the step 130, 16 literals were copied into the output buffer, starting at the current output pointer position. The number 16 (in this example) is a constant, irrespective of the number (7) of valid literals. But only the first 7 of these 16 copied literals are valid decoded data. Accordingly, the output pointer is updated so as to move seven characters forward in the output data buffer. This means that the next copy operation by the step 130 will start (in the output buffer) not at the end of the previous copy operation but seven characters after the start of the previously copied block, thereby overwriting the previously copied but invalid last 9 characters.

One of another two pointers need to be updated at the step 150, depending on whether the copy operation concerned literals or a code pair. If the last copy operation concerned literals, then a pointer to the next literal (in the literal stream) to be used is updated (in the example, by seven positions). If the last copy operation concerned a code pair, then a pointer to the next available code pair in the code pair stream is updated.

Finally, the contents of the search buffer are updated to reflect the most recently decoded data. The updating of the search buffer involves copying the newly added and valid characters in the output buffer to the search buffer, to reflect the decoding performed in that operation cycle.

Control then returns to the step 100 for the next cycle of operation.

The use of the separate streams of data, particularly (though not exclusively) with a Cell microprocessor, gives an efficient decoding process. The steps 110 or 120 are carried out by just one instruction, as is the step 130. So the whole cycle from the step 100 to the step 150 can be completed in a relatively small number of instructions.

An example Cell processor implementation shown below wouldn't be five instructions, but a particular hardware implementation could be as little as 5 instructions.

[
// Fetch 32 bytes ( aligned to 16 bytes ) that contain required unaligned 16 byte stream
lq b0to15,base,distance
lq b16to31,base16,distance
// Generate 16 byte aligned stream, with repeats as needed
shufb aligned,b0to15,b16to31,AlignRepeat -continued

```
// Aligned 16 write block may contain 0-14 previously valid bytes
lq write,dest
// Insert stream up to aligned end
shufb write,write,aligned,insert0
sq write,dest
// Generate overflow into next 16 byte aligned block
shufb write,aligned,aligned,overflow
sq write,dest+16
]
```

FIGS. 5a to 5d show a schematic worked example of data decompression in accordance with the flowchart of FIG. 4. The streams of data shown in FIG. 3b are used as inputs to this worked example. A search buffer is shown schematically as the block 160 and a sixteen bit group copied by the step 130 is shown schematically as a block 170.

Figure 5A:
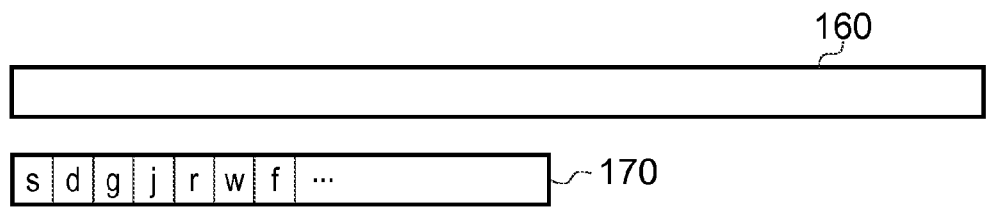
FIGS. 5a to 5d show a schematic worked example of data decompression in accordance with the flowchart of FIG. 4.

The first three flags in FIG. 3b are literal flags. Therefore, the step 130 copies 16 literals for output, starting from the literal "s" (FIG. 5a). Only the first three of these are valid, and so the step 150 results in "s", "d", "g" being written to the search buffer, and the "next literal" pointer being updated to point to the literal "j" in the literal stream of FIG. 3b.

Figure 5B:
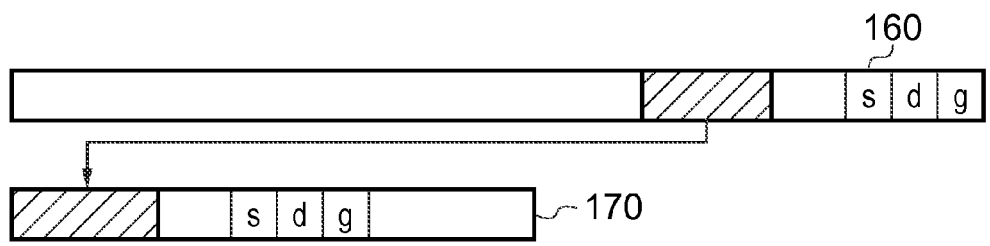
Figure 5C:
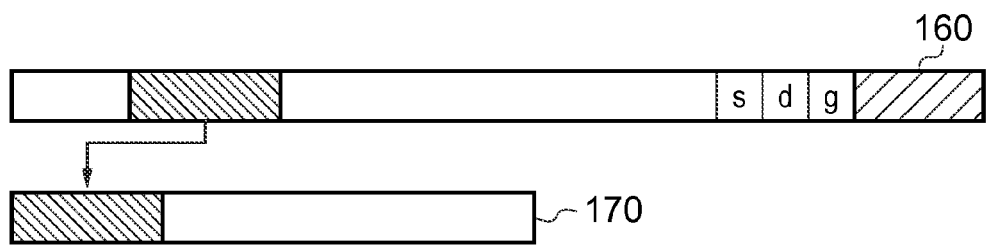
Figure 5D:
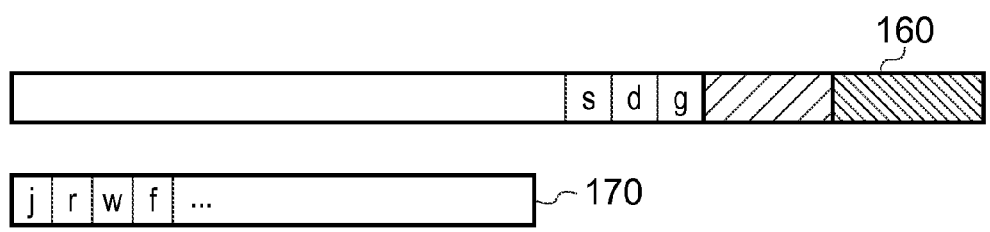

The next flag is a code pair flag. In FIG. 5b, the first code pair (7,4) is read from the code pair stream, and an appropriate copy of 16 characters is made from the search buffer to output. Note that these characters include the recently-written characters s, d, g from the search buffer. The first 4 of these characters are valid and are copied back to the search buffer. If there are not enough characters in the search buffer the constant 16 character copy is made up of duplicated versions of these codes. The need for this is detected if the distance variable is less than 16 and is implemented as a simple table. ie:

Distance 7: 16 characters are {0,1,2,3, 4,5,6,0, 1,2,3,4, 5,6,0,1}

Distance 9: 16 characters are {0,1,2,3, 4,5,6,7, 8,9,0,1, 2,3,4,5}

The next flag is also a code pair flag. The next code pair (12,3) is read and the process carried out in FIG. 5c as above.

Finally, the next two flags are literal flags. A block of 16 literals starting from "j" is copied in FIG. 5d, of which the first two characters are valid data.

Note that in some embodiments the search buffer is not in fact needed in the form of a separate store. The information held in the search buffer is also held in the output buffer, so the function of the search buffer could be achieved simply by means of updatable pointers to the validly decoded data held in the output buffer. The step of updating the search buffer (part of the step 150 described above) would simply involve updating the pointers.

Figure 6A:
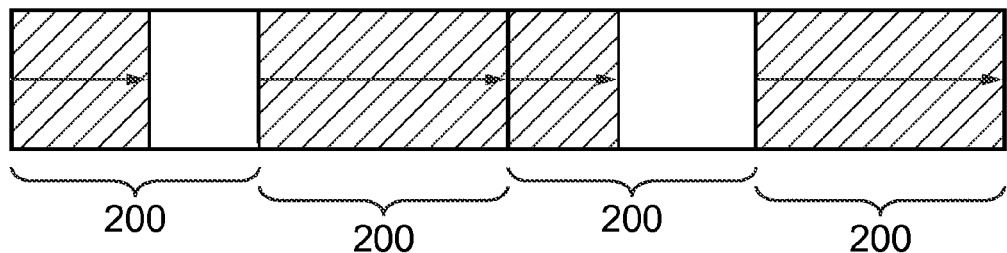
FIGS. 6a to 6c schematically illustrate a parallel compression technique.
Figure 6B:
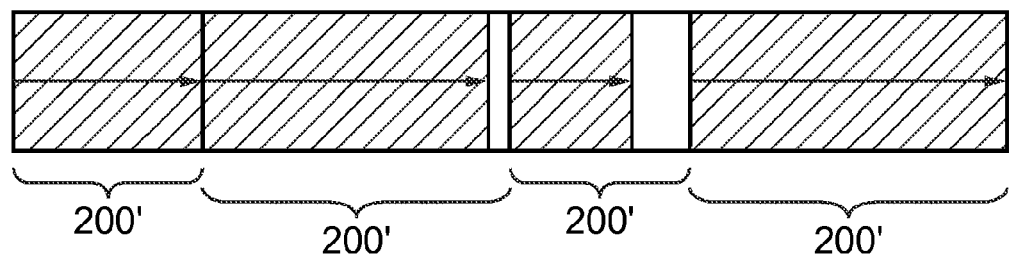
Figure 6C:
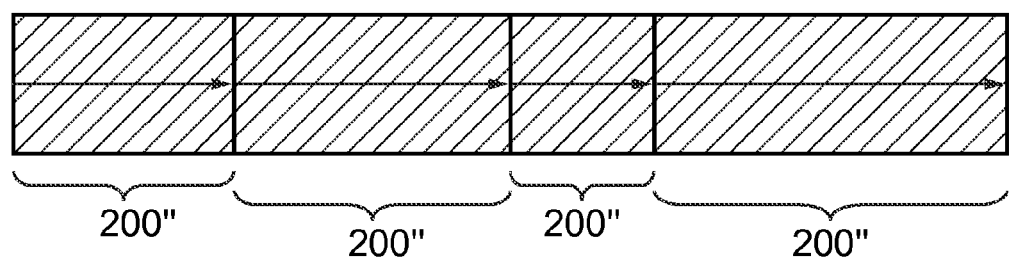

FIGS. 6a to 6c schematically illustrate a parallel decompression technique. This represents a further technique that is particularly (though not exclusively) useful in connection with the Cell microprocessor.

As described above, previously proposed techniques using code pairs and literals are essentially linear techniques. Linear processing does not lend itself well to operation by parallel processors such as the Cell microprocessor and others. The following technique allows parallel processing to be used efficiently to deal with data compression and decompression.

The basic principle is that the data to be compressed are divided into plural blocks of data. In FIGS. 6a to 6c, four such blocks 200 are shown, but this number has been selected simply for clarity of the drawing. In practice, the number of blocks could be chosen so as to suit the parallel processing capabilities of the processor in use. So, for example, with the full specification Cell processor, up to eight blocks would be appropriate so as to make efficient use of the eight available sub-processors within the full specification Cell processor.

The blocks are compressed and decompressed separately, although it can be made possible for the compression/decompression of one block to use references (by distance-length pairs) into search buffers associated with other blocks as well as with the block being processed.

For improved efficiency, particularly at decompression, the blocks are made variable in size, and an iterative process is used to derive the block size and to compress the data. This arrangement (which will be described below) is particularly suitable for handling data which needs to be decompressed quickly and efficiently, for example video or texture data (or the like) used during the processing of a video game. Often there are large quantities of such data which have to be compressed in order to fit them into a game storage medium (e.g. a Blu-Ray® disc) but which are required to be decompressed well within a video frame period. Such an arrangement can make good use of a system which provides improved decompression by means of a more processor-intensive compression process.

The block sizes are selected so that the blocks take about the same number of instruction cycles to decompress. The number of cycles needed at decompression depends on the sizes of matching blocks found during decompression and also the number and distribution of literals which need to be encoded. Generally, a trial compression is considered the only reliable method of detecting the number of instruction cycles needed at decompression.

So, referring to FIGS. 6a to 6c, in FIG. 6a shows four (initially) equally sized blocks 200 of data to be compressed. Each is subjected to a compression process, illustrated schematically by a shaded portion of each block having been compressed (at a time part way through the process) and an unshaded portion not having yet been compressed. The compression processes for the four blocks can be run in parallel though in fact this is not necessary at the time of compression.

The relative progress in compressing the four blocks depends on the nature of the content of each block, and specifically, how easily it compresses. In FIG. 6b, it can be seen that if the block boundaries are moved, the progress through the revised blocks 200' is much more uniform, and a small further movement in FIG. 6c (blocks 200") again gives a more uniform progress still.

But it is not the compression time, or the quantity of compressed data, that should be made nearer to being uniform. It is the decompression time or, more precisely, the number of instruction cycles needed to decompress the data, that should be made uniform. By doing this, all of the parallel processes at decompression will start and finish at the same time. Of course, exact uniformity is not required; just an aim to get as uniform as is reasonably possible.

Figure 7:
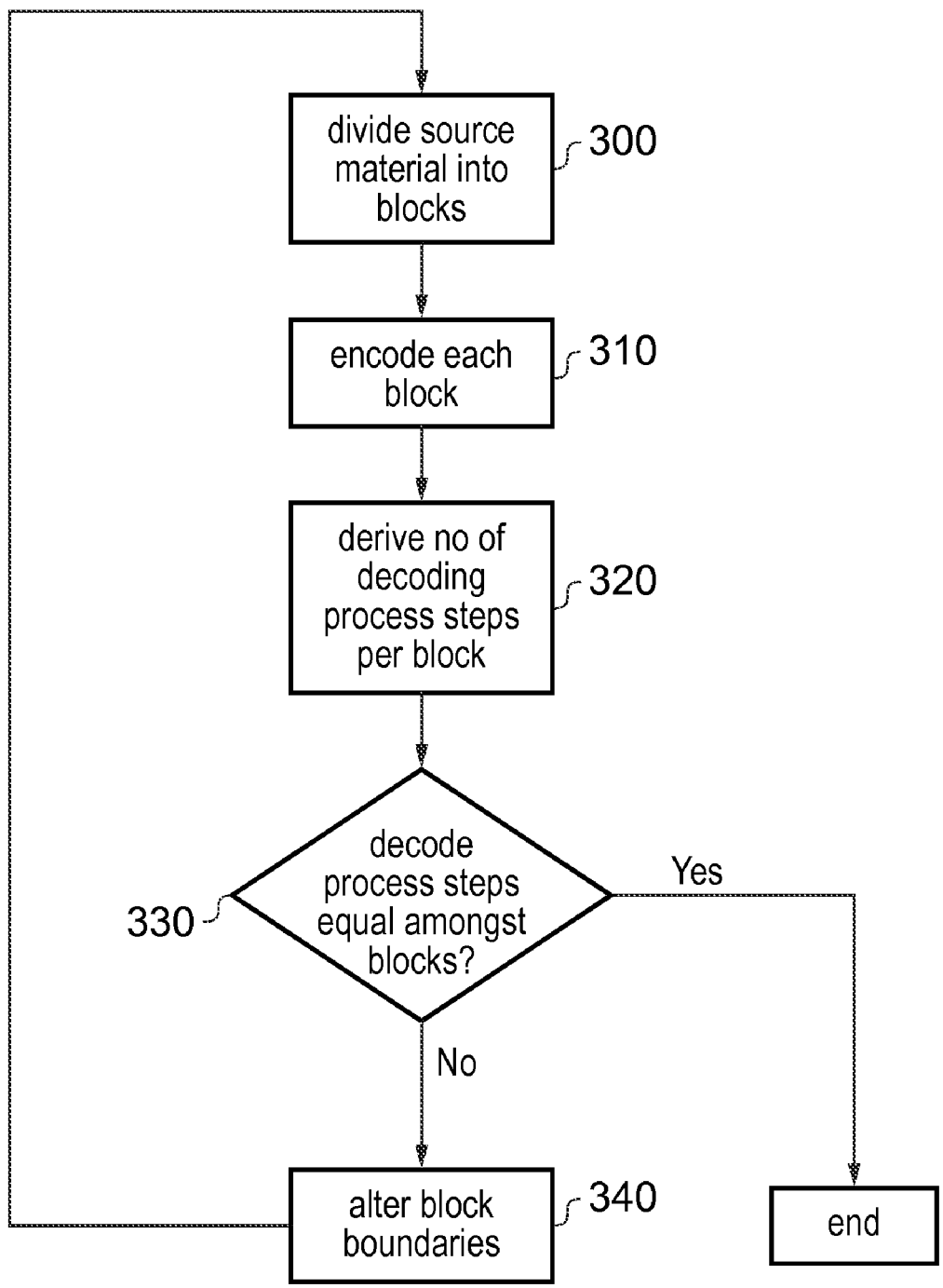
FIG. 7 is a schematic flow chart showing the parallel compression technique.

To illustrate this point, FIG. 7 is a schematic flow chart showing a parallel compression technique as just described.

At a step 300, source material (data to be compressed) is divided into two or more contiguous blocks of data. Initially, this can be a division based on equal block sizes, though it is possible to introduce a weighting of the sizes based on a statistical analysis of the source material.

At a step 310, each block is compression-encoded using one of the techniques described above.

At a step 320, the number of processing steps (instruction cycles) needed to decode (decompress) each encoded block is detected. This can be derived by a statistical analysis of the encoded data (e.g. how many literals, lengths of consecutive groups of literals, how many code pairs etc, based on a knowledge of how many instruction cycles each such data item requires) or by an actual trial decompression.

At a step 330 a detection is made as to whether the decompression processing requirements are evenly distributed amongst the blocks. Here, the skilled person will appreciate that "evenly" can mean "exactly evenly" or perhaps "evenly to within (say) 2%".

If the distribution is even (as defined) then the process ends; the blocks (as already compressed at the step 310) have been compressed appropriately for a parallel decompression using that number of decompression processors. If, however, the distribution is uneven (as defined) then the block boundaries are moved at a step 340. A block which required more processing to decompress is made smaller, and vice versa. The changes in block size can be in proportion to the differences in decompression processing requirements. So, for example, in a four-block system, if the processing requirements (normalised to 100) are as follows:

| Block A | Block B | Block C | Block D |
|---------|---------|---------|---------|
| 110     | 100     | 90      | 100     | then the size of block A is reduced by $\frac{1}{11}^{th}$ and the size of block C is increased by the same amount. This may well mean that both the start and end boundaries of block B move, while keeping the block size of block B the same. As (in this example) this change in boundaries alone can affect the data content and therefore the processing requirements for decompressing block B, it is appropriate to process all four blocks again at the step 310 rather than just the blocks which have changed in size.

Figure 8:
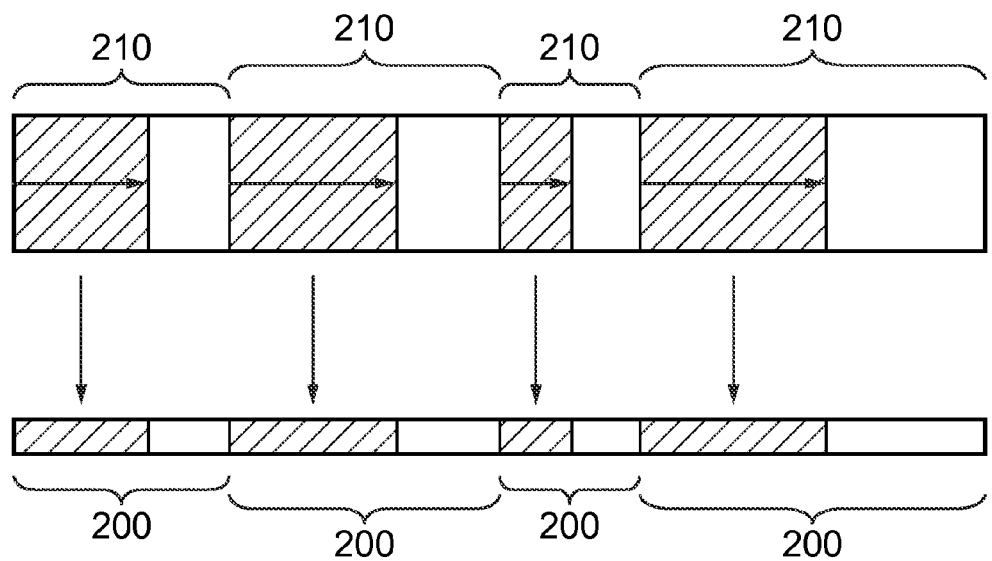
FIG. 8 schematically illustrates a parallel decompression technique.

At decompression, each block is decompressed in parallel. Even though the block sizes (and the size of the compressed data for each block) may well be different, the intention is that the block decompression processes all start and finish at (or nearly at) the same time. FIG. 8 schematically illustrates such a parallel decompression technique, about half way through. The start point for decompression of each block is indicated by indicator data (not shown). Each compressed block 210 is being decompressed back to an original block 200, with progress so far being illustrated by a shaded portion representing already-decompressed data.

Figure 9A:
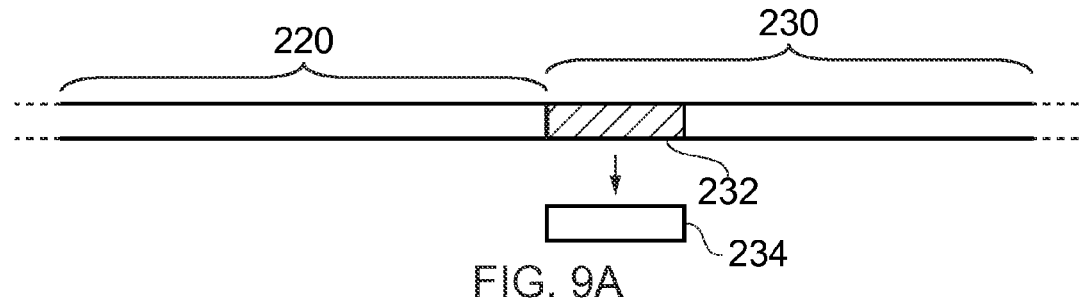
FIGS. 9a to 9c schematically illustrate a feature of the parallel decompression technique relating to the first one or more decoded characters of each block.
Figure 9B:
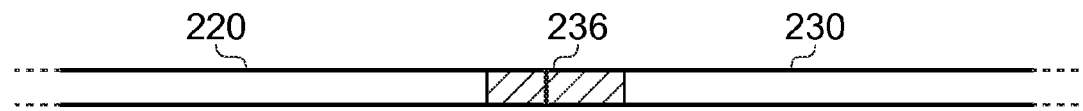
Figure 9C:
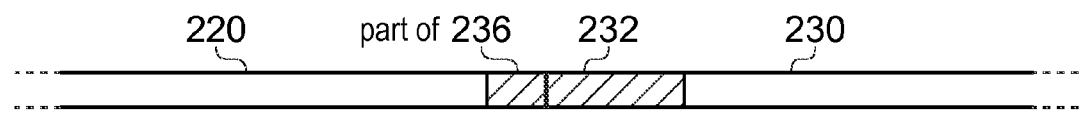

FIGS. 9a to 9c schematically illustrate a feature of the parallel decompression technique relating to the first one or more decoded characters of each block. In particular, if the decompression technique of FIG. 4 is used, there can be a problem involving the overlap of the 16 character blocks written out by the step 130.

The problem could arise because the blocks represent contiguous sections of a larger set of source data. When they are decompressed, they will likely be stored in a contiguous area of memory. This could mean that the last-written 16 character group at the end of decompression of one block could overwrite valid data already decompressed at the start of the next block.

FIG. 9a schematically illustrates just two output blocks, 220, 230. The decompression process proceeds from the left hand end of the block (as drawn) towards the right. Only the end portion of the block 220 and the start portion of the block 230 are shown.

A first 16 character group is written by the step 130 into the block 230. While some of the characters may not be valid, it is a fact that at least the very first character is valid. The decompression of the block 230 continues until the output pointer (see the description of the step 150 above) has moved forwards beyond the sixteenth character in the block 230. At that time, it is a fact that the whole of the first 16 characters of the block 230 (shown in FIG. 9a by a shaded group 232) is valid. That group of 16 characters is copied to a store 234 which is separate from the output buffer.

Decompression then proceeds as described above. Towards the end of the decompression of the block 220 (in fact, as they all finish together, towards the end of all of the decompression processes), a final block of 16 characters is written by the step 130. This is shown schematically as a shaded area 236 in FIG. 9b. It can be seen that the data 236 spans the boundary of the two blocks. Those characters of the group 236 falling within the block 220 are of course valid data. Those falling over the boundary, i.e. into the block 230, are invalid data—an artefact of the copy operation of the step 130. But these overwrite valid data previously written when the start portion of the block 230 was decompressed.

The solution is to rewrite the stored data 232 into the first 16 characters of the block 230 after the decompression of the preceding block 220 has completed.

It will be appreciated that because at least one character of the last-written 16 character group of the preceding block 220 must fall within that preceding block 220, it is strictly only necessary to preserve the first 15 characters of each block to be sure of reinstating any data corrupted by the decompression of the preceding block. But since the present system is designed to handle 16 character data words efficiently, a 16 character group 232 is preserved.

Figure 10:
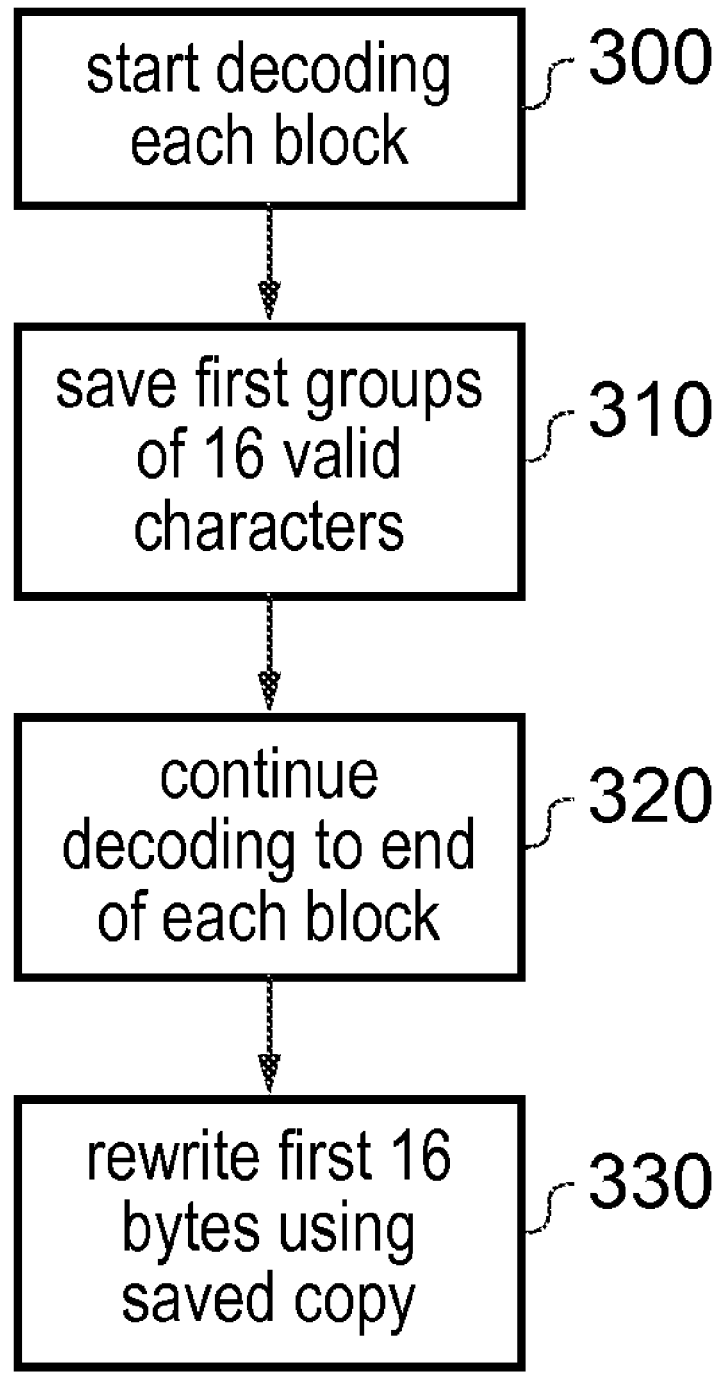
FIG. 10 is a schematic flow chart showing the parallel decompression technique.

FIG. 10 is a schematic flow chart showing the parallel decompression technique described above. This process assumes that source data was compressed into two or more contiguous blocks, though the efficiency improvements for parallel operation described with reference to FIG. 7 are not a requirement for the method of FIG. 10 to be useful.

At a step 300, the decompression of each block is started. Once 16 valid characters have been decompressed (as indicated, for example, by the output pointer going past the $16^{th}$ character), at a step 310 a group of the first 16 decompressed characters is saved, i.e. stored in a separate memory area.

At a step 320, decompression continues to the end of each block.

Finally, at a step 330, the saved 16 characters from the start of each block are rewritten to their original positions.

Clearly, this measure does not necessarily need to be taken for the first block in the set of contiguous blocks derived from a particular source material. But it can be more straightforward in a parallel system to use the same processing for each block, i.e. to carry out these steps even for the first block.

Figure 11:
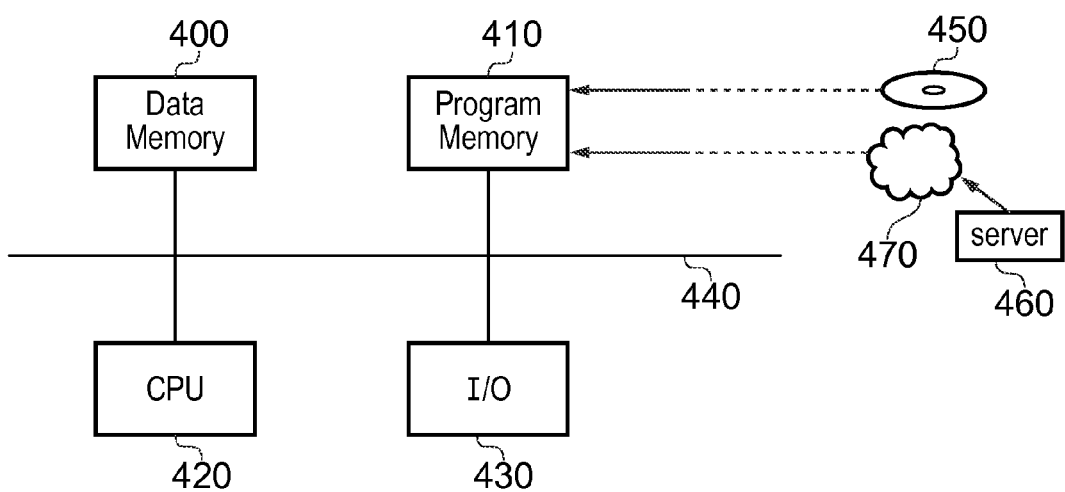
FIG. 11 is a schematic diagram of a data compression and/or decompression apparatus.

Finally, FIG. 11 is a schematic diagram of a data compression and/or decompression apparatus.

The apparatus is shown in a simplified form for clarity of the diagram. The skilled person will appreciate that other routine components may be needed.

The apparatus comprises a data memory 400 (which stores, for example, the search buffer and the output buffer holding compressed or decompressed data), a program memory 410, a central processing unit (CPU) 420 (such as a Cell microprocessor) and input/output logic 430, all interconnected via a bus 440.

The apparatus carries out the operations described above by the CPU 420 executing program code stored in the program memory 410. Such program code could be obtained from a storage medium such as a disc medium 450, or by a transmission medium such as a data connection to a server 460, possibly via the internet or another network 470, or by other known software distribution means or computer program product.

Alternatively, of course, it will be appreciated that the functionality of FIG. 11 could be achieved by bespoke hardware or by semi-programmable hardware such as an ASIC (application specific integrated circuit) or FPGA (field programmable gate array).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Data decompression apparatus arranged to act on compressed data comprising:
   an ordered stream of references to groups of previously decoded data items;
   an ordered stream of direct representations of data items to be decoded; and
   an ordered stream of flags indicating whether each successive decompression operation should act on a reference or a direct representation;
   the apparatus comprising:
   an output memory area;
   a detector to detect the number n of consecutive flags indicating that a decompression operation should act on a direct representation; and
   a data copier for copying to the output memory area either a next referenced group of previously decoded data or a group of n consecutive direct representations from the ordered stream of direct representations.

2. Apparatus according to claim 1, in which the data copier is arranged:
   to maintain a pointer with respect to the output memory area indicating the extent of validly decompressed data already written to the output memory area;
   to copy a group of m consecutive data items irrespective of the size of the referenced group or the number n; and
   to set the pointer in dependence on the size of the referenced group or the number n.

3. Apparatus according to claim 1, in which the data to be decompressed comprises a series of two or more contiguous blocks of data, the apparatus comprising:
   a data store, separate from the output memory area, for storing a first-decompressed group of data items corresponding to at least blocks other than the first block in the series; the data store being arranged to rewrite the stored group of data items to its original position after decompression of the preceding block in the series has completed.

4. Apparatus according to claim 3, in which the blocks are arranged in size so that each block requires substantially the same amount of decompression processing.

5. Apparatus according to claim 4, in which the blocks are decompressed in parallel.

6. A data decompression method arranged to act on compressed data comprising:
   an ordered stream of references to groups of previously decoded data items;
   an ordered stream of direct representations of data items to be decoded; and
   an ordered stream of flags indicating whether each successive decompression operation should act on a reference or a direct representation;
   the method comprising the steps of:
   detecting the number n of consecutive flags indicating that a decompression operation should act on a direct representation; and
   copying to an output memory area either a next referenced group of previously decoded data or a group of n consecutive direct representations from the ordered stream of direct representations.

* * * * *